(12) United States Patent
Lee

(10) Patent No.: US 8,426,230 B2
(45) Date of Patent: Apr. 23, 2013

(54) THIN FILM TRANSISTOR SUBSTRATE AND METHOD FOR FABRICATING THE SAME

(75) Inventor: Min-Jic Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 67 days.

(21) Appl. No.: 13/289,779

(22) Filed: Nov. 4, 2011

(65) Prior Publication Data

US 2012/0305947 A1    Dec. 6, 2012

(30) Foreign Application Priority Data

Jun. 1, 2011  (KR) .................. 10-2011-0053026

(51) Int. Cl.
*H01L 21/00*  (2006.01)
*H01L 33/00*  (2010.01)

(52) U.S. Cl.
USPC .................. 438/34; 257/88; 257/E33.062

(58) Field of Classification Search .................. 438/34; 257/88, E33.062
See application file for complete search history.

(56) References Cited

U.S. PATENT DOCUMENTS

| 2010/0053059 | A1* | 3/2010  | Kim et al. ........................ 345/99 |
| 2010/0127960 | A1* | 5/2010  | Jung et al. ........................ 345/89 |
| 2010/0321353 | A1* | 12/2010 | Bae et al. ........................ 345/205 |
| 2011/0221790 | A1* | 9/2011  | Takahashi ........................ 345/690 |
| 2012/0127412 | A1* | 5/2012  | Lee et al. ........................ 349/139 |

* cited by examiner

*Primary Examiner* — David S Blum
(74) *Attorney, Agent, or Firm* — Birch, Stewart, Kolasch & Birch, LLP

(57) ABSTRACT

A thin film transistor substrate and a method for fabricating the same are discussed. According to an embodiment, the thin film transistor substrate includes a gate line arranged on a substrate in a first direction; a data line arranged in a second direction crossing the gate line to define adjacent first and second pixel regions, the data line being used in common by the first and second pixel regions; an entire common line arranged in the second direction substantially parallel with the data line; a thin film transistor including a gate electrode connected with the gate line, a source electrode connected with the data line, a drain electrode formed to face the source electrode, and an active layer formed to be overlapped with the gate electrode by interposing a gate insulating film between the active layer and the gate electrode; and a pixel electrode connected with the drain electrode.

20 Claims, 9 Drawing Sheets

US 8,426,230 B2

THIN FILM TRANSISTOR SUBSTRATE AND METHOD FOR FABRICATING THE SAME

This application claims the priority benefit of the Korean Patent Application No. 10-2011-0053026, filed on Jun. 1, 2011, which is hereby incorporated by reference as if fully set forth herein.

BACKGROUND OF THE INVENTION

1. Field of the Invention

The present invention relates to a thin film transistor substrate and a method for fabricating the same, and more particularly, to a thin film transistor substrate and a method for fabricating the same in which an aperture ratio can be improved.

2. Discussion of the Related Art

Demands for various display devices have increased with development of an information society. Accordingly, many efforts have been made to research and develop various flat display devices such as liquid crystal display (LCD), plasma display panel (PDP), electroluminescent display (ELD), and vacuum fluorescent display (VFD). Some of flat display devices have already been applied to displays or equipment.

Among the various flat display devices, liquid crystal display (LCD) devices have been most widely used due to advantageous characteristics of thin profile, lightness in weight, and low power consumption, whereby the LCD devices provide a substitute for a Cathode Ray Tube (CRT). In addition to mobile type LCD devices such as a display for a notebook computer or mobile terminal, LCD devices have been developed for computer monitors and televisions to receive and display broadcasting signals.

The LCD device includes a color filter substrate provided with a color filter array, a thin film transistor substrate provided with a thin film transistor array, and a liquid crystal layer formed between the color filter substrate and the thin film transistor substrate.

The color filter substrate is provided with a color filter for displaying colors and a black matrix for preventing light leakage from occurring. The thin film transistor substrate is provided with a plurality of pixel electrodes formed in a matrix arrangement, wherein a data signal is separately supplied to the plurality of pixel electrodes. Also, the thin film transistor substrate is provided with a plurality of thin film transistors (TFTs), each thin film transistor for separately driving the pixel electrodes. The thin film transistor substrate further includes gate lines controlling the thin film transistors, and data lines supplying data signals to the thin film transistors.

The aforementioned thin film transistor substrate includes gate drive ICs for driving the gate lines and data drive ICs for driving the data lines. As the thin film transistor substrate increases in size and requires a high resolution, the number of required drive ICs increases.

However, since the data drive IC is more expensive than the other devices, a double rate driving (DRD) type thin film transistor substrate has been suggested to reduce its fabricating cost. In the DRD type thin film transistor substrate, adjacent pixel regions use one data line in common. Also, in the DRD type thin film transistor substrate, the number of gate lines needed is increased to two times, whereas the number of data lines needed is reduced to ½ times and the number of data drive ICs needed is also reduced to ½ times. In this case, even though the number of data lines is reduced, the same resolution as that of the related art thin film transistor substrate can be obtained.

FIG. 1 is a plane view illustrating a DRD type thin film transistor substrate of a liquid crystal display device according to the related art.

As shown in FIG. 1, in the DRD type thin film transistor substrate, since two adjacent sub pixels use one data line DL1, DL2, or DL3 in common, the number of data lines can be reduced to half of that of the data lines needed in the non-DRD type thin film transistor. However, since gate lines GL1, GL2, GL3 and GL4 are additionally provided in the DRD type thin film transistor substrate, an aperture ratio is reduced within the range of 8% to 12%.

As a variation, a fringe electric field mode thin film transistor substrate is provided, which operates liquid crystal molecules through a fringe electric field formed between a pixel electrode and a common electrode, which are overlapped with each other by interposing an insulating film therebetween. In the fringe electric field mode thin film transistor substrate, a '⊏' shaped common line is formed in the pixel region to connect common electrodes of pixel regions that use the data line DL in common. The '⊏' shaped common line is rotated at ±90° and parallel with the gate line GL and the data line DL.

The common line is overlapped with the pixel electrode to form a storage capacitor. When the pixel electrode is formed on the insulating film, if a distortion with respect to the substrate occurs, the capacitance of the storage capacitor of the pixel regions at both sides of the data line DL is varied, whereby a spot caused by a luminance difference may occur, which is undesirable.

SUMMARY OF THE INVENTION

Accordingly, the present invention is directed to a thin film transistor substrate and a method for fabricating the same, which substantially obviate one or more problems due to limitations and disadvantages of the related art.

An object of the present invention is to provide a thin film transistor substrate of a liquid crystal display device and a method for fabricating the same, in which a common line parallel with a data line is formed and a common line parallel with a gate line is removed to improve an aperture ratio.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a thin film transistor substrate according to an embodiment of the present invention comprises a substrate; a gate line arranged on the substrate in a first direction; a data line arranged in a second direction crossing the gate line to define pixel regions and used in common by adjacent pixel regions; a common line arranged in the second direction parallel with the data line; a thin film transistor including a gate electrode connected with the gate line, a source electrode connected with the data line, a drain electrode formed to face the source electrode, and an active layer formed to be overlapped with the gate electrode by interposing a gate insulating film therebetween; a pixel electrode connected with the drain electrode; a passivation film formed on an entire surface of the gate insulating film including the thin film transistor; common electrodes formed on the passivation film and connected with the common line through a common contact hole formed by selectively removing the passivation film; and a connection portion formed on the passivation film to be overlapped with the data line by interposing the passivation film therebetween, connecting the common electrodes of the adjacent pixel regions with each other.

The gate line and the gate electrode can have a double layer structure in which a transparent conductive material layer and a non-transparent conductive material layer are deposited in due order.

The pixel electrode can be formed in the same layer as the gate line and electrically connected with the drain electrode through a connection electrode formed along a pixel contact hole formed by selectively removing the gate insulating film and the passivation film.

The connection electrode can be formed in the same layer as the common electrode.

The common electrodes can be formed to be overlapped with the common line at the edge of the pixel regions.

In another aspect of the present invention, a method for fabricating a thin film transistor substrate comprises forming a gate line and a gate electrode arranged on a substrate in a first direction; forming a gate insulating film on an entire surface of the substrate including the gate line and the gate electrode; forming an active layer on the gate insulating film corresponding to the gate electrode; forming a common line arranged on an entire surface of the gate insulating film including the active layer in a second direction crossing the gate line to define pixel regions and forming a data line and source and drain electrodes, the data line being used in common by adjacent pixel regions and the common line being arranged in the second direction parallel with the data line; forming a pixel electrode connected with the drain electrode; forming a passivation film formed on an entire surface of the gate insulating film including the source and drain electrodes, the data line and the common line and forming a common contact hole by selectively removing the passivation film, the common contact hole exposing the common line; and forming common electrodes and a connection portion on the passivation film, the common electrodes connected with the common line through the common contact hole and the connection portion overlapped with the data line by interposing the passivation film therebetween to connect the common electrodes of the adjacent pixel regions with each other.

In the method, the gate line and the gate electrode can be formed in a double layer structure in which a transparent conductive material layer and a non-transparent conductive material layer are deposited in due order.

In the method, the pixel electrode can be formed in the same layer as the gate line in a single layer structure of the transparent conductive material layer.

In the method, the pixel electrode can be electrically connected with the drain electrode through a pixel contact hole formed by selectively removing the gate insulating film and the passivation film.

In the method, the pixel electrode can be formed using a halt tone mask.

In the method, the common electrodes can be formed to be overlapped with the common line at the edge of the pixel regions.

The thin film transistor substrate and the method for fabricating the same according to the embodiments of the present invention have at least the following advantages.

First of all, the common electrodes of the adjacent pixel regions that use one data line in common are connected with each other through the connection portion formed in the region overlapped with the data line to remove the common line parallel with the gate line in the pixel regions, whereby an aperture ratio can be improved.

In addition, the pixel electrode is formed in the same layer as the gate line, and the common electrodes are formed on the uppermost layer, whereby the common electrodes can remove electric field interference between the data line and the pixel electrode.

According to an embodiment, the present invention provides a thin film transistor substrate comprising: a substrate; a gate line arranged on the substrate in a first direction; a data line arranged in a second direction crossing the gate line to define adjacent first and second pixel regions, the data line being used in common by the first and second pixel regions; an entire common line arranged in the second direction substantially parallel with the data line; a thin film transistor including a gate electrode connected with the gate line, a source electrode connected with the data line, a drain electrode formed to face the source electrode, and an active layer formed to be overlapped with the gate electrode by interposing a gate insulating film between the active layer and the gate electrode; a pixel electrode connected with the drain electrode; a passivation film formed on an entire surface of the gate insulating film including the thin film transistor; and common electrodes formed on the passivation film and connected with the common line through a common contact hole formed by selectively removing the passivation film.

According to an embodiment, the present invention provides a method for forming a thin film transistor substrate, the method comprising: forming a gate line arranged on a substrate in a first direction; forming a data line arranged in a second direction, the data line crossing the gate line to define adjacent first and second pixel regions, the data line being used in common by the first and second pixel regions; forming an entire common line arranged in the second direction substantially parallel with the data line; forming a thin film transistor including a gate electrode connected with the gate line, a source electrode connected with the data line, a drain electrode facing the source electrode, and an active layer to be overlapped with the gate electrode by interposing a gate insulating film between the active layer and the gate electrode; forming a pixel electrode connected with the drain electrode; forming a passivation film on an entire surface of the gate insulating film including the thin film transistor; and forming common electrodes on the passivation film and connected with the common line through a common contact hole.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Hereinafter, a thin film transistor substrate according to embodiments of the present invention will be described. Here, the thin film transistor substrate according to the present invention is preferably part of a liquid crystal display device, but can be part of other display devices or electronics as suitable. Further, in the below, although two adjacent pixel regions separated by a data line commonly shared may be discussed as an example, the thin film transistor substrate includes a plurality of such pixel regions.

Figure 1:
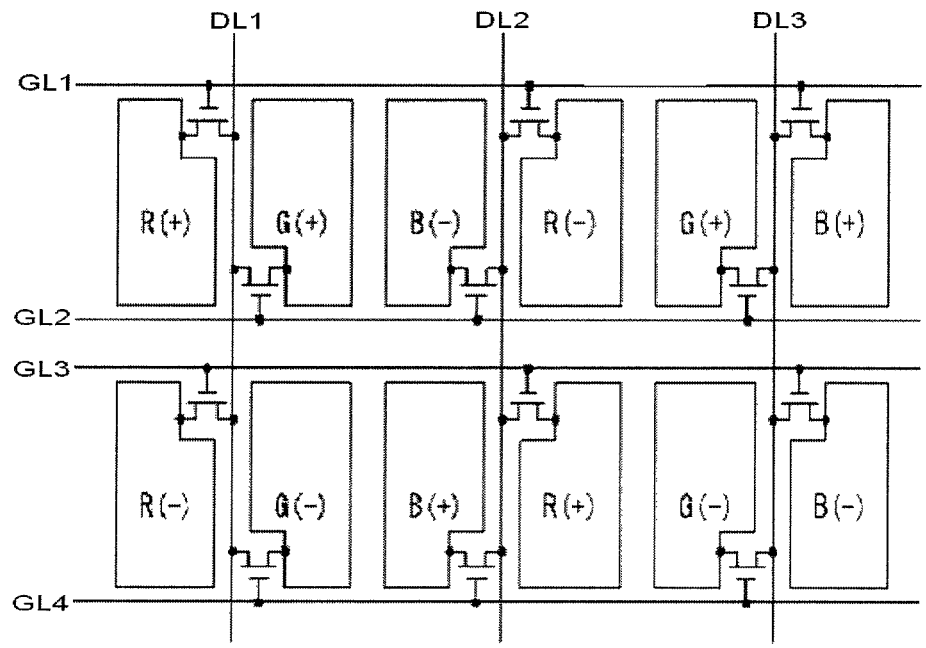
FIG. 1 is a plane view illustrating a general DRD type thin film transistor substrate of a liquid crystal display device according to a related art.
Figure 2A:
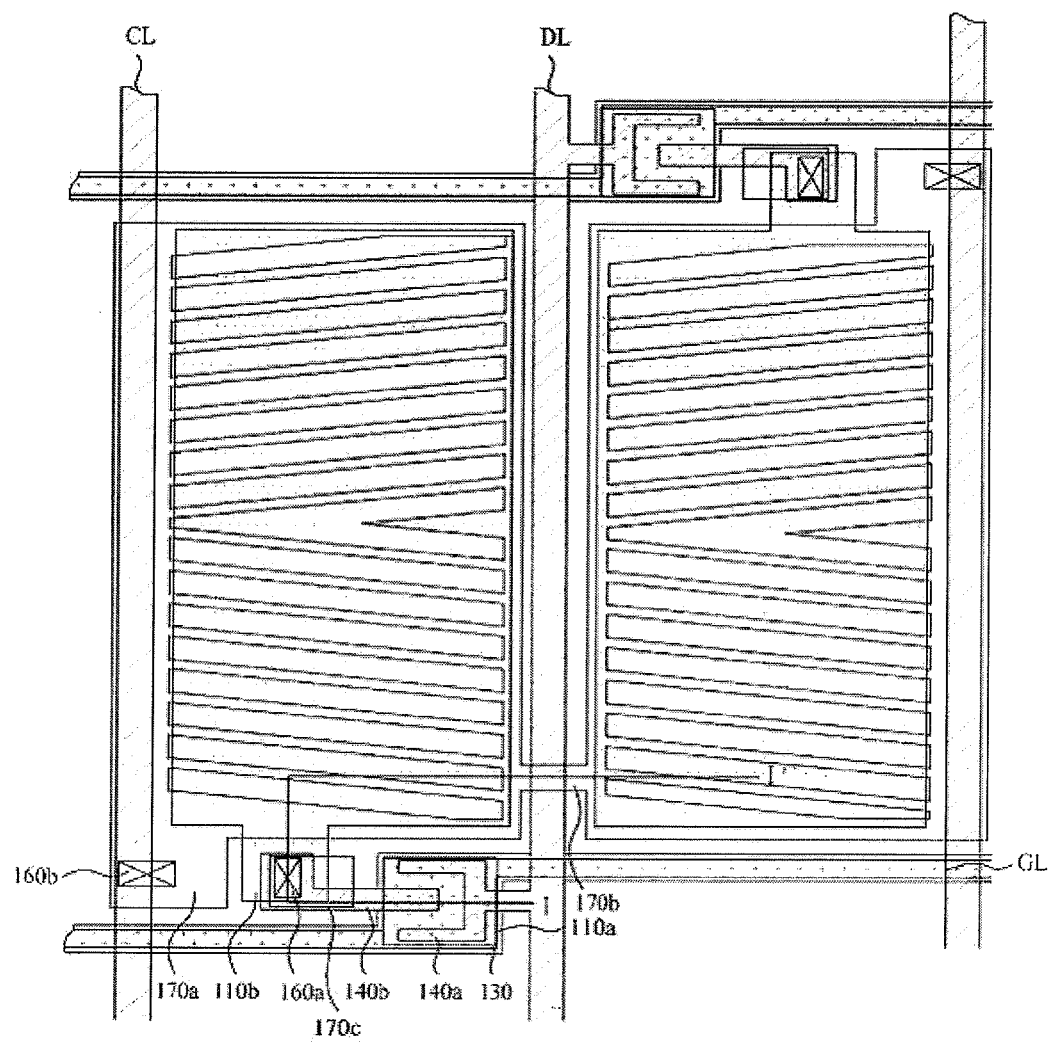
FIG. 2A is a plane view illustrating a thin film transistor substrate of a liquid crystal display device according to an embodiment of the present invention.
Figure 2B:
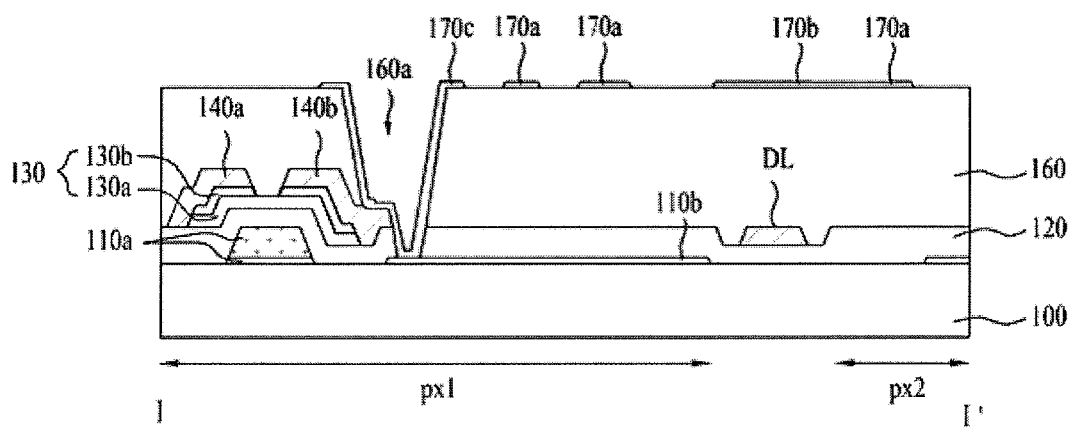
FIG. 2B is a cross-sectional view taken along line I-I' of the thin film transistor substrate shown in FIG. 2A.

FIG. 2A is a plane view illustrating a thin film transistor substrate of a liquid crystal display device according to an embodiment of the present invention, and FIG. 2B is a cross-sectional view taken along line I-I' of the thin film transistor substrate shown in FIG. 2A.

Referring to FIG. 2A and FIG. 2B, the thin film transistor substrate of the present invention includes a gate line GL and a data line DL arranged on the substrate 100 to define a pixel region by crossing each other, a common line CL formed in parallel with the data line DL, a thin film transistor formed in a crossing region of the gate line GL and the data line DL, a pixel electrode 110b connected with a drain electrode 140b of the thin film transistor and formed in a plate electrode type, and common electrodes 170a including a plurality of slits formed on a passivation film 160 to form a fringe field together with the pixel electrode 110b. Here, the common electrodes covering two adjacent pixel regions preferably have the same slit configuration/pattern where the slits are oriented in the same directions.

The aforementioned thin film transistor substrate of the present invention is driven by a double rate driving (DRD) mode in which first and second pixel regions px1 and px2 use one data line DL in common based on the data line DL. In this case, the number of data lines DL and the number of data drive ICs are reduced to ½, whereby the fabricating cost of the thin film transistor substrate can be reduced.

The gate line GL and a gate electrode 110a formed on the substrate 100 may have a double layer structure in which a transparent conductive material layer such as tin oxide (TO), indium tin oxide (ITO), indium zinc oxide (IZO) and indium tin zinc oxide (ITZO) and a non-transparent conductive material layer such as Mo, Ti, Cu, AlNd, Al, Cr, Mo alloy, Cu alloy, and Al alloy are deposited on the substrate in due order, or may have a single layer structure of a non-transparent conductive material layer. In FIGS. 2A and 2B, the gate line GL and the gate electrode 110a are formed in a double layer structure in which the transparent conductive layer and the non-transparent conductive layer are deposited in due order.

The gate electrode 110a may be projected from the gate line GL to supply a scan signal from the gate line GL. Alternatively, the gate electrode 100a may not be projected from one side of the gate line GL but be defined as a partial region of the gate line GL.

The pixel electrode 110b formed in the same layer as the lower layer of the gate electrode 110a is formed in a plate electrode type of a single layer. Here, the phrase "formed in the same layer" used above can preferably mean that the pixel electrode 110b and the lower layer of the gate electrode 110a are formed at the same time (i.e., it uses a same layer to form both layers) and/or using the same material. The use of the same phrase in all other instances in the present specification means the same with respect to those layers mentioned in such instance. Also, the pixel electrode 110b is formed of a transparent conductive material such as tin oxide (TO), indium tin oxide (ITO), indium zinc oxide (IZO) and indium tin zinc oxide (ITZO), which corresponds to the lower layer of the gate electrode 110a.

A gate insulating film 120 is formed of an inorganic insulating material such as SiOx and SiNx on the entire surface including the gate electrode 110a and the pixel electrode 110b. An active layer 130 that includes a semiconductor layer 130a and an ohmic contact layer 130b deposited in due order is overlapped with the gate electrode 110a by interposing the gate insulating film 120 therebetween.

The ohmic contact layer 130b formed on the semiconductor layer 130a serves to reduce electric contact resistance between source and drain electrodes 140a and 140b and the semiconductor layer 130a. The ohmic contact layer 130b corresponding to a portion where the source electrode 140a is spaced apart from the drain electrode 140b is removed to form a channel that exposes the semiconductor layer 130a.

The data line DL, which defines the pixel region by crossing the gate line DL, the common line CL, and the source and drain electrodes 140a and 140b may be formed in a deposition structure in which more than double layers such as Al/Cr, Al/Mo, Al(Nd)/Al, Al(Nd)/Cr, Mo/Al(Nd)/Mo, Cu/Mo, Ti/Al(Nd)/Ti, Mo/Al, Mo/Ti/Al(Nd), Cu alloy/Mo, Cu alloy/Al, Cu alloy/Mo alloy, Cu alloy/Al alloy, Al/Mo alloy, Mo alloy/Al, Al alloy/Mo alloy, Mo alloy/Al alloy, and Mo/Al alloy are deposited, or may be formed of a non-transparent conductive material layer of a single layer structure such as Mo, Ti, Cu, AlNd, Al, Cr, Mo alloy, Cu alloy, and Al alloy. For instance, the data line DL, the common line CL and the source and drain electrodes 140a and 140b can be formed with a same material at the same time.

The data line DL is used or shared in common by the two adjacent pixel regions, mainly the first and second pixel regions px1 and px2 adjacent to each other. The source electrode 140a is connected with the data line DL and supplied with a pixel signal of the data line DL. The drain electrode 140b is formed to face the source electrode 140a by interposing the channel of the semiconductor layer 130a therebetween.

The drain electrode 140b is electrically connected with the pixel electrode 110b formed in the same layer as the gate line GL through a connection electrode 170c formed along a pixel contact hole 160a. The pixel contact hole 160a is formed by selectively removing the gate insulating film 120 and the passivation film 160 to supply the pixel signal from the data line DL to the pixel electrode 110b. In this case, the connection electrode 170c is formed of a transparent conductive material in the same layer as the common electrodes 170a.

The passivation film 160 is formed on the entire surface of the gate insulating film 120 including the thin film transistor that includes the gate electrode 110a, the active layer 130, and the source and drain electrodes 140a and 140b. The common electrodes 170a having the plurality of slits are formed on the passivation film 160 and connected with the common line CL through a common contact hole 160b (FIG. 2A) formed by selectively removing the passivation film 160, whereby contact resistance can be reduced.

The common electrodes 170a are formed in a single layer structure of a transparent conductive material layer like the pixel electrode 110b and overlapped with the pixel electrode 110b by interposing the passivation film 160 and the gate insulating film 120 between the pixel electrode 110b and the common electrodes 170a, whereby a fringe electric field is formed. If the pixel electrode 110b is formed in the same layer as the data line DL, the pixel electrode 110b and the common electrodes 170 are overlapped with each other by interposing the passivation film 160 only therebetween, whereby a fringe electric field is formed.

In the liquid crystal display device having the thin film transistors substrate of the present invention, liquid crystal molecules provided between the thin film transistor substrate and a color filter substrate are rotated by dielectric anisotropy through the fringe electric field. Light transmittance of the pixel regions is varied depending on a rotation level of the liquid crystal molecules, whereby a picture image is displayed.

In particular, the common electrodes 170a are overlapped with the respective common line CL at the edges of the pixel regions px1 and px2, whereby an aperture ratio is more improved.

As described above, in the general DRD type thin film transistor substrate, the first and second pixel regions px1 and px2 adjacent to each other use one data line DL in common, whereby the number of data lines DL and the number of data driving ICs can be reduced.

In the general DRD type thin film transistor substrate according to the related art, however, the aperture ratio is more deteriorated by the common line CL parallel with the gate line in the pixel region. If distortion with respect to the substrate occurs when the pixel electrode 110b is formed, storage capacitance of the first and second pixel regions px1 and px2 based on the data line DL is varied, whereby a spot caused by the luminance difference may occur.

Accordingly, in the thin film transistor substrate of the present invention, a connection portion 170b for connecting the common electrodes 170a of the adjacent first and second pixel regions px1 and px2 that use one data line DL in common is formed in the region overlapped with the data line DL to prevent the aperture ratio from being deteriorated. The connection portion 170b preferably can have a bridge shape for connecting the common electrodes 170a of the first and second pixel regions px1 and px2.

In other words, the common electrodes 170a of the first and second pixel regions px1 and px2 are connected with each other through the connection portion 170b formed to be overlapped with the data line DL but not to be inside of the pixel regions, whereby the common line CL parallel with the gate line GL in the pixel regions px1 and px2 is not needed and is eliminated by the present invention. Accordingly, the aperture ratio is not deteriorated and is improved, by not forming the common line CL in the pixel regions.

Since the first and second pixel regions px1 and px2 that use the data line DL in common have the same structure or substantially the same structure, even though a black matrix formed in the color filter substrate opposite to the thin film transistor substrate is shifted, a luminance difference of the first and second pixel regions px1 and px2 does not occur. Further, the common electrodes 170a covering the first pixel region px1 and the common electrodes 170a covering the second pixel region px2 have the same configuration or shape or the substantially the same configuration/shape. Preferably, they have the identical/same configuration/shape. For instance, as shown in FIG. 2A, the common electrodes 170a covering the first pixel region px1 have the same slit pattern as the common electrodes 170a covering the second pixel region px2.

Accordingly, spots can be prevented from being generated by the luminance difference. Also, the picture quality of the display device can be prevented from being deteriorated by the luminance difference.

Moreover, in the thin film transistor substrate of the present invention, the common electrodes 170a are formed on the uppermost layer of the thin film transistor substrate, whereby the electric field, which may be generated between the data line DL and the pixel electrode 110b, is blocked by the common electrodes 170a, wherein the data line DL is arranged between the first and second pixel regions px1 and px2. As a result, a distance between the data line DL and the common electrodes 170a can be reduced, which then improves the aperture ratio.

Figure 3A:
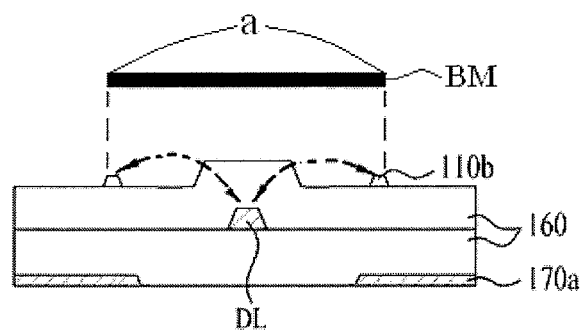
FIG. 3A is a cross-sectional view illustrating a general thin film transistor substrate provided with a pixel electrode formed on the uppermost layer thereof according to a related art.
Figure 3B:
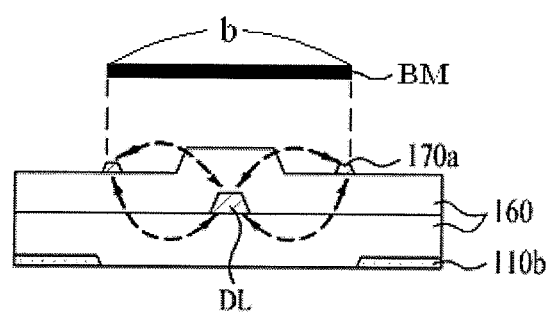
FIG. 3B is a cross-sectional view illustrating a thin film transistor substrate provided with common electrodes formed on the uppermost layer thereof according to an embodiment of the present invention.

In more detail, FIG. 3A is a cross-sectional view illustrating a general thin film transistor substrate provided with a pixel electrode formed on the uppermost layer thereof according to a related art, and FIG. 3B is a cross-sectional view illustrating a thin film transistor substrate provided with common electrodes formed on the uppermost layer thereof according to an embodiment of the present invention. In these drawings, the pixel electrode, the common electrodes, the data line and the passivation film may be only shown.

As shown in FIG. 3A, in the general thin film transistor substrate according to the related art, the pixel electrode 110b is formed on an uppermost layer of the substrate. When a color filter substrate having a black matrix (BM) is combined with the thin film transistor substrate with a liquid crystal layer therebetween, the BM is positioned to correspond with or cover each of the data lines. At this time, the BM corresponding to one data line DL has a width of 'a' and the pixel electrodes 110b are formed above the common electrodes 170a with the passivation film 160 therebetween. Accordingly, the electric field is formed between the data line DL and the pixel electrode 110b, whereby liquid crystal may be driven abnormally or light leakage may occur. To prevent this problem from occurring, the pixel electrode 110b and the data line DL are positioned such that a distance between the pixel electrode 110b and the data line DL is large or increased. However, when this distance is increased, the aperture ratio is reduced which is undesirable.

Accordingly, the present invention addresses these limitations of the related art by providing the common electrodes 170a above the pixel electrodes 110b. For instance, referring to FIG. 3B, by forming the common electrodes 170a on an uppermost layer of the substrate according to the thin film transistor substrate of the present invention, the electric field, which may occur between the data line DL and the pixel electrode 110b, is blocked by the common electrodes 170a. Further, the common electrodes 170a (which are positioned at a higher layer than the pixel electrodes 110b) are formed closer to the data line DL than the pixel electrodes 110b. In this case, the BM of the color filter substrate when combined with the thin film transistor substrate of the present invention is formed to have a width 'b', which would be less than the width 'a' of the BM of FIG. 3A and which would increase the aperture ratio. Thus, by using the present invention, the aperture ratio can be increased. That is, there is no need for the distance between the common electrodes 170a and the data line DL to be increased in the present invention. Since the common electrodes 170a and the data line DL can be positioned such that the distance between the common electrodes 170a and the data line DL can be reduced, the aperture ratio can be improved by the configurations of the present invention.

Hereinafter, a method for fabricating the thin film transistor substrate according to an embodiment of the present invention will be described.

FIG. 4A to FIG. 4D are plane views illustrating a method for fabricating a thin film transistor substrate according to an embodiment of the present invention; and FIG. 5A to FIG. 5D are cross-sectional views taken along line I-I' of the thin film transistor substrate shown in FIG. 4A to FIG. 4D.

Figure 4A:
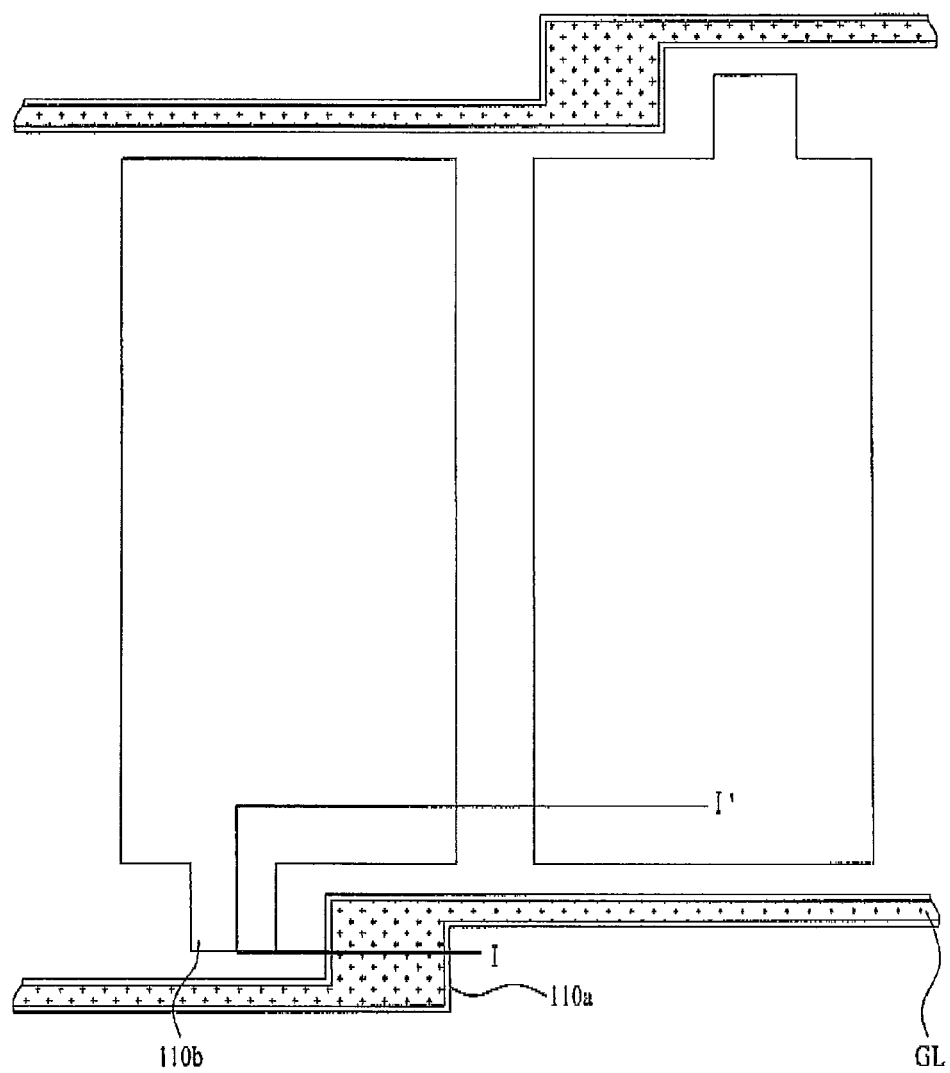
FIG. 4A to FIG. 4D are plane views illustrating a method for fabricating a thin film transistor substrate of a liquid crystal display device according to an embodiment of the present invention.
Figure 5A:
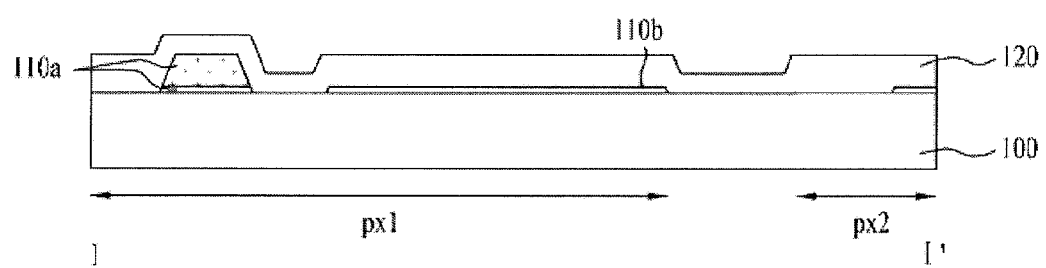
FIG. 5A to FIG. 5D are cross-sectional views taken along line I-I' of the thin film transistor substrate shown in FIG. 4A to FIG. 4D.

As shown in FIG. 4A and FIG. 5A, the gate electrode 110a, the gate line GL and the pixel electrode 110b are formed on the substrate 100. For example, a transparent conductive material layer such as tin oxide (TO), indium tin oxide (ITO), indium zinc oxide (IZO) and indium tin zinc oxide (ITZO) and a non-transparent conductive material layer such as Mo, Ti, Cu, AlNd, Al, Cr, Mo alloy, Cu alloy, and Al alloy are deposited on the substrate 100 in due order by a deposition method such as a sputtering method.

The transparent conductive material layer and the non-transparent conductive material layer are patterned by using a half tone mask to form the gate electrode 110a and the gate line GL in a double layer structure of the transparent conductive material layer and the non-transparent conductive material layer, which are deposited in due order. And, the plate electrode type pixel electrode 110b is formed in a single layer structure of the transparent conductive material layer only.

The gate insulating film 120 is formed on the entire surface of the substrate 100 including the gate electrode 110a, the gate line GL and the pixel electrode 110b.

Figure 4B:
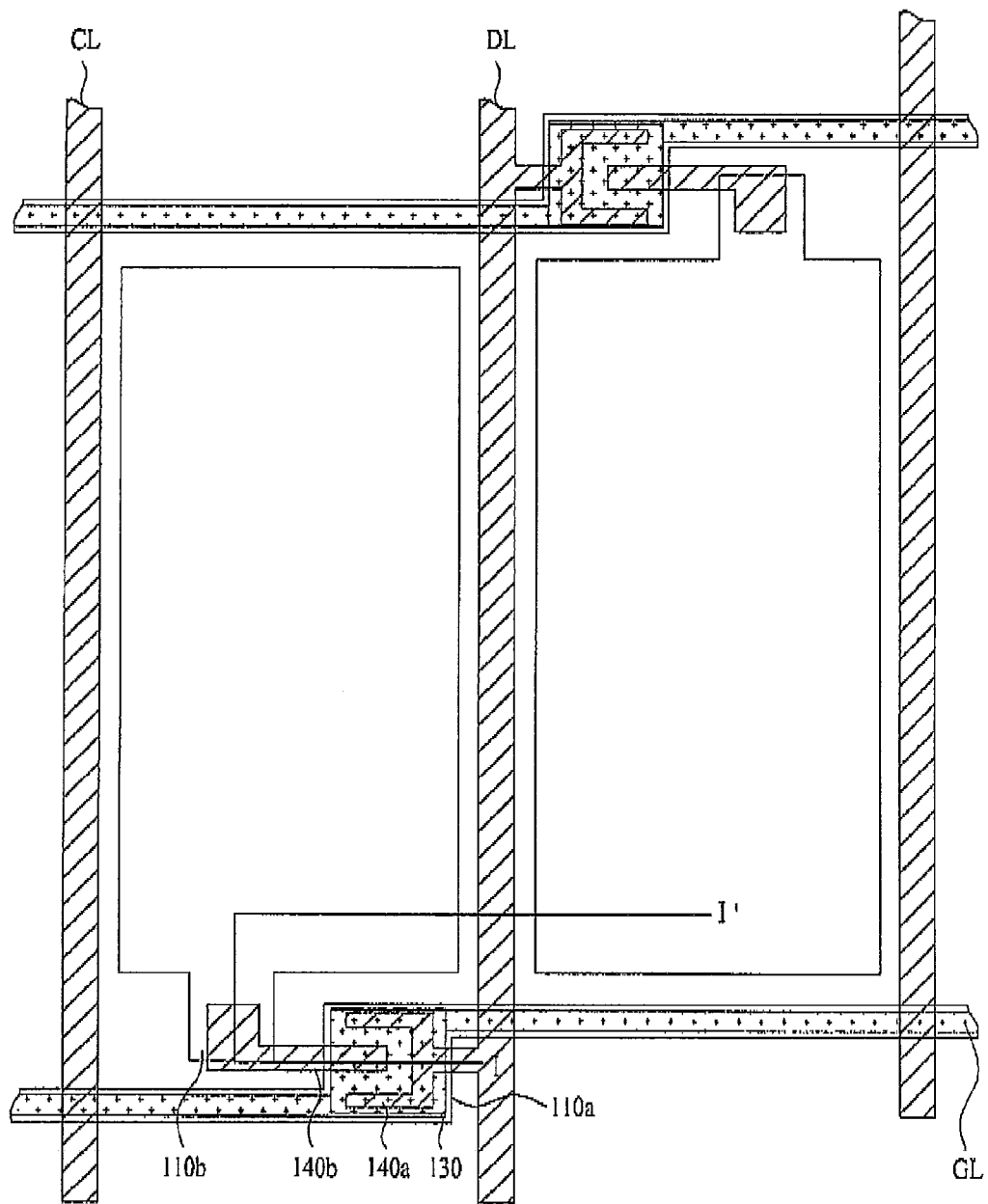
Figure 5B:
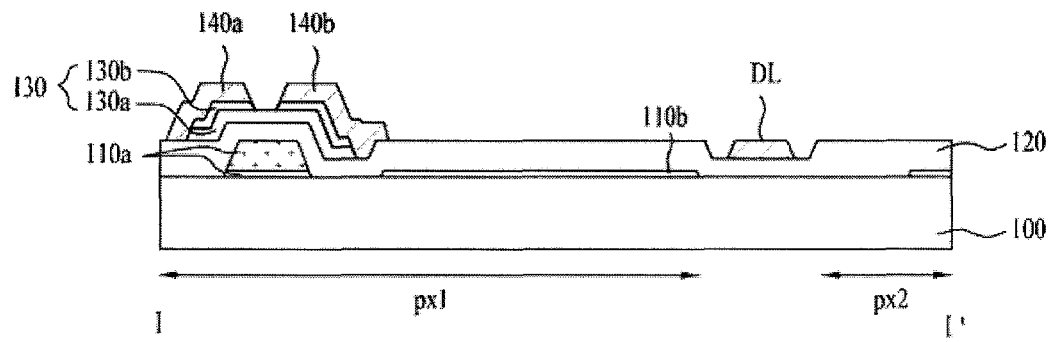

As shown in FIG. 4B and FIG. 5B, the active layer 130 of the semiconductor layer 130a and the ohmic contact layer 130b, which are deposited in due order, are formed on the gate insulating film 120 corresponding to the gate electrode 110a.

The data line DL that defines the pixel region by vertically crossing the gate line GL and the source and drain electrodes 140a and 140b spaced apart from each other at a predetermined interval are formed on the gate insulating film 120 including the active layer 130 by a deposition method such as a sputtering method.

The data line DL, the common line CL and the source and drain electrodes 140a and 140b may be formed in a deposition structure in which more than double layers such as Al/Cr, Al/Mo, Al(Nd)/Al, Al(Nd)/Cr, Mo/Al(Nd)/Mo, Cu/Mo, Ti/Al(Nd)/Ti, Mo/Al, Mo/Ti/Al(Nd), Cu alloy/Mo, Cu alloy/Al, Cu alloy/Mo alloy, Cu alloy/Al alloy, Al/Mo alloy, Mo alloy/Al, Al alloy/Mo alloy, Mo alloy/Al alloy, and Mo/Al alloy are deposited, or may be formed of a non-transparent conductive material layer of a single layer structure such as Mo, Ti, Cu, AlNd, Al, Cr, Mo alloy, Cu alloy, and Al alloy. For instance, the data line DL, the common line CL and the source and drain electrodes 140a and 140b may be formed of a same material at the same time.

In this case, to reduce a mask process, the active layer 130 and the source and drain electrodes 140a and 140b may be formed at the same time by using a half tone mask.

The data line DL is used in common or shared by the first and second pixel regions px1 and px2 adjacent to each other. The drain electrode 140b is electrically connected with the pixel electrode 110b through the pixel contact hole 160a to be formed by selectively removing the gate insulating film 120 and the passivation film 160, and a channel is formed by removing the ohmic contact layer 130b exposed to the spaced region between the source and drain electrodes 140a and 140b.

Figure 4C:
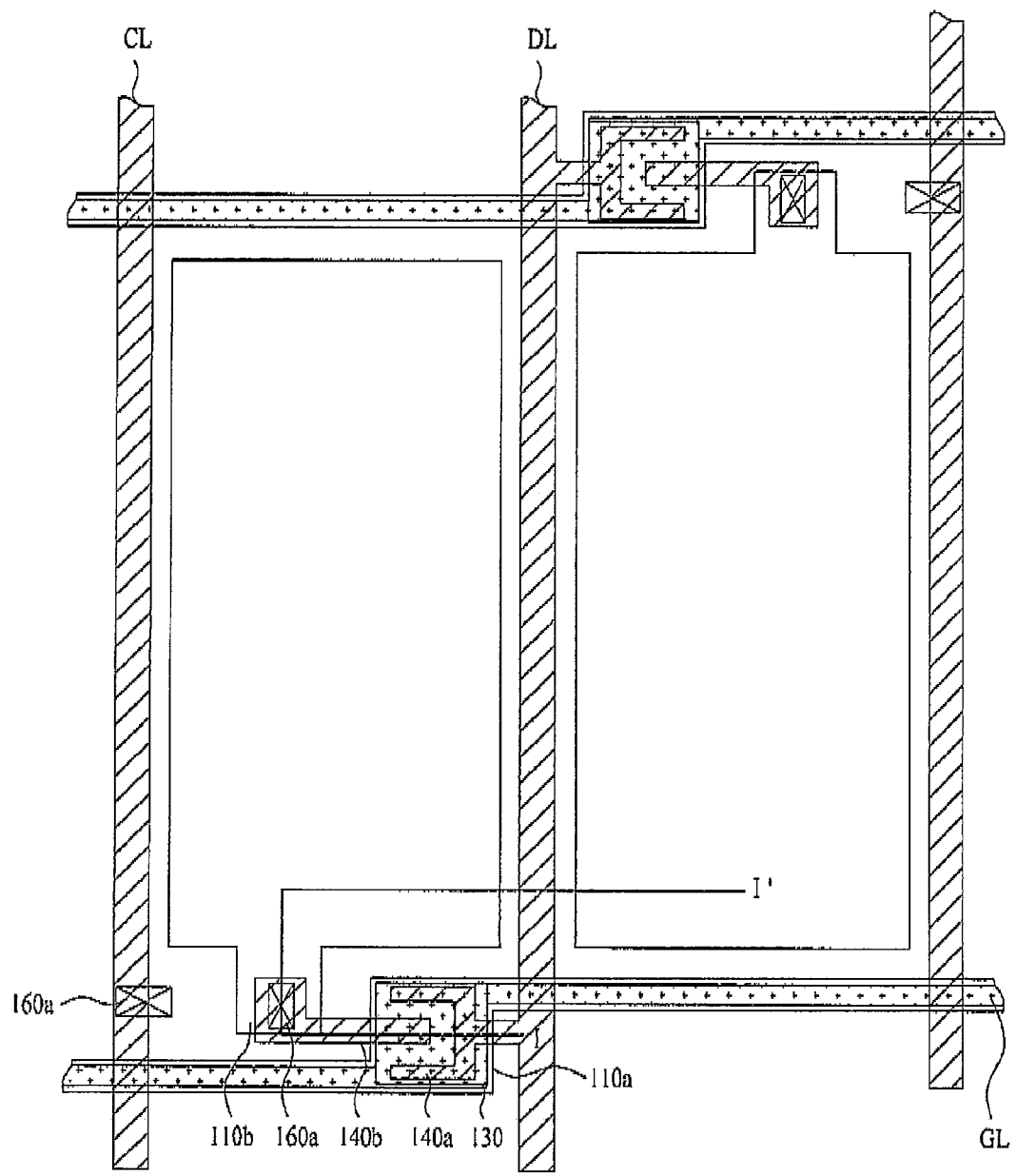
Figure 5C:
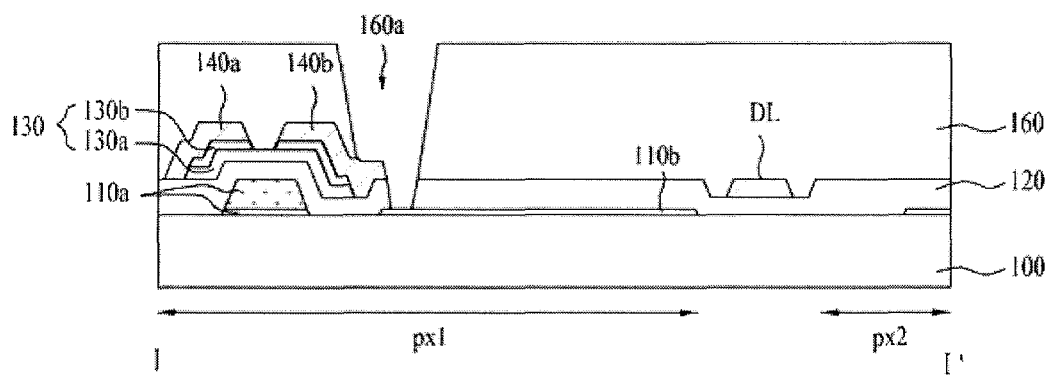

As shown in FIG. 4C and FIG. 5C, the passivation film 160 is formed on the entire surface of the gate insulating film 120 including the source and drain electrodes 140a and 140b and the data line DL. The pixel contact hole 160a that exposes the drain electrode 140b and the pixel electrode 110b is formed by selectively removing the passivation film 160 and the gate insulating film 120.

Figure 4D:
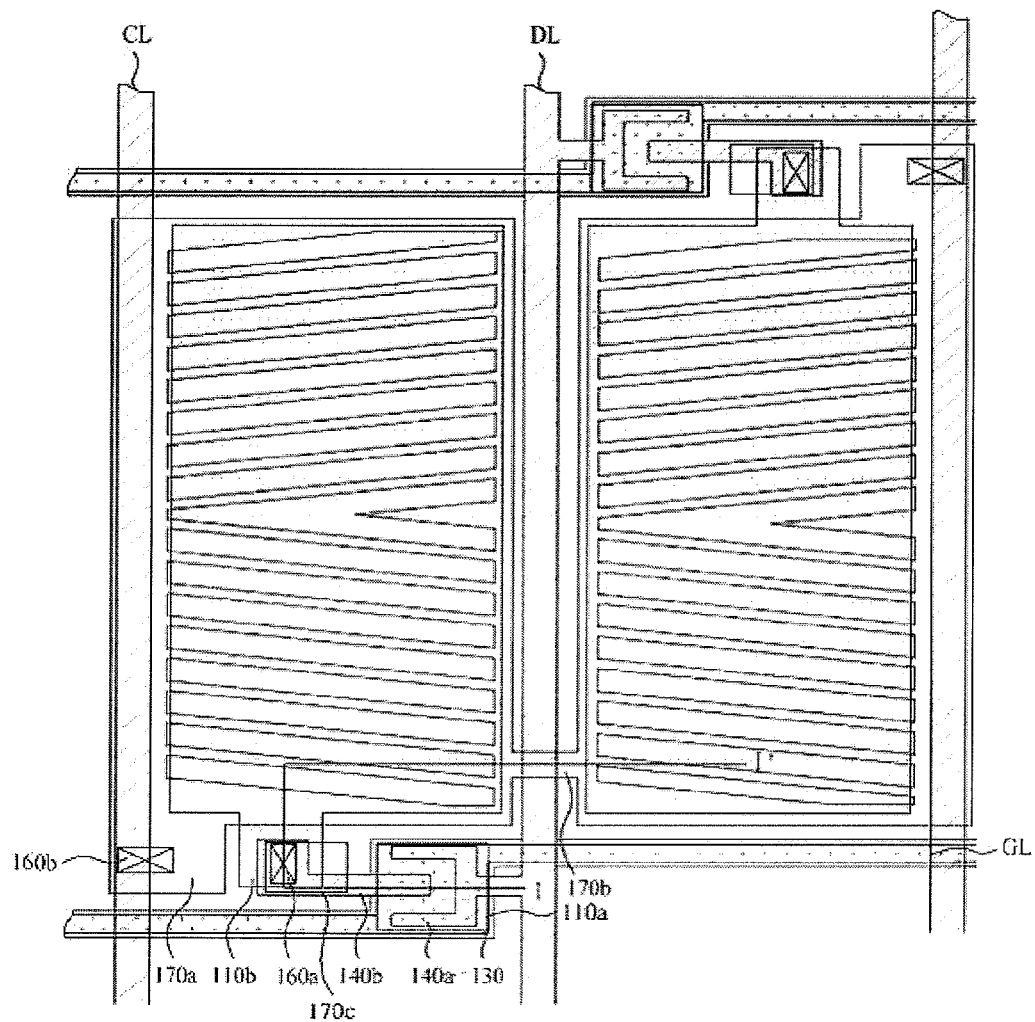
Figure 5D:
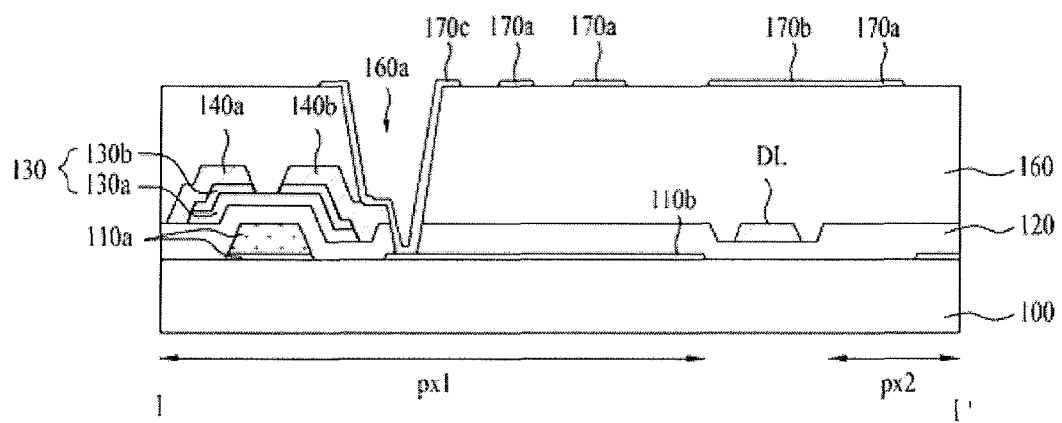

As shown in FIG. 4D and FIG. 5D, the transparent conductive material layer is formed on the entire surface of the passivation film 160 and then patterned to form the common electrodes 170a having the plurality of slits.

The common electrodes 170a are electrically connected with the common line CL through the common contact hole 160b formed by selectively removing the passivation film 160. In this case, the common electrodes 170a are overlapped with the common line CL at the edges of the pixel regions px1 and px2, whereby the aperture ratio is further improved.

The common electrodes 170a are also overlapped with the pixel electrode 110b by interposing the gate insulating film 120 and the passivation film 160 therebetween, whereby a fringe electric field is formed. The connection portion 170b for connecting the common electrodes 170a of the first and second pixel regions px1 and px2 that use the data line DL in common is formed in the region overlapped with the data line DL.

In other words, the common electrodes 170a of the first and second pixel regions px1 and px2 adjacent to each other are connected with each other through the connection portion 170b formed to be overlapped with the data line DL and not being inside of the pixel regions, whereby the common line CL parallel with the gate line GL in the pixel regions px1 and px2 (which was needed and present in the related art) is no longer needed and is thus eliminated. Accordingly, the aperture ratio can be improved by the common line CL.

In particular, the common electrodes 170a and the connection portion 170b are formed and at the same time the connection electrode 170c for connecting the drain electrode 140b with the pixel electrode 110b is formed, whereby the drain electrode 140b is electrically connected with the pixel electrode 110b. As a result, the drain electrode 140b supplies the pixel signal from the data line DL to the pixel electrode 110b.

In the thin film transistor substrate of the present invention, the common electrodes 170a are formed on an uppermost layer of the substrate, whereby the electric field that may be generated between the data line DL and the pixel electrode 110b can be blocked by the common electrodes 170a, which further improves the aperture ratio.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor substrate comprising:
a substrate;
a gate line arranged on the substrate in a first direction;
a data line arranged in a second direction crossing the gate line to define adjacent first and second pixel regions, the data line being used in common by the first and second pixel regions;
an entire common line arranged in the second direction substantially parallel with the data line;
a thin film transistor including a gate electrode connected with the gate line, a source electrode connected with the data line, a drain electrode formed to face the source electrode, and an active layer formed to be overlapped with the gate electrode by interposing a gate insulating film between the active layer and the gate electrode;
a pixel electrode connected with the drain electrode;
a passivation film formed on an entire surface of the gate insulating film including the thin film transistor; and
common electrodes formed on the passivation film and connected with the common line through a common contact hole formed by selectively removing the passivation film.

2. The thin film transistor substrate according to claim 1, further comprising:
a connection portion formed on the passivation film and over the data line by interposing the passivation film between the connection portion and the data line, the connection portion connecting the common electrodes of the first and second pixel regions with each other.

3. The thin film transistor substrate according to claim 1, wherein the gate line and the gate electrode have a double layer structure in which a transparent conductive material layer and a non-transparent conductive material layer are deposited in order.

4. The thin film transistor substrate according to claim 1, wherein the pixel electrode and the gate line are formed using a same material, and the pixel electrode is electrically connected with the drain electrode through a connection electrode.

5. The thin film transistor substrate according to claim 4, wherein the connection electrode and the common electrode are formed using a same material.

6. The thin film transistor substrate according to claim 1, wherein the common electrodes are formed over the common line at edges of the first and second pixel regions.

7. The thin film transistor substrate according to claim 2, wherein the common electrodes and the connection portion are formed with a same material.

8. The thin film transistor substrate according to claim 2, wherein the connection portion is in a bridge shape for connecting the common electrodes of the first and second pixel regions.

9. The thin film transistor substrate according to claim 1, wherein the common electrodes extend over the first or second pixel region, the common line, and an area between the common line and the first or second pixel region.

10. The thin film transistor substrate according to claim 1, wherein the common electrodes include first common electrodes covering the first pixel region and second common electrodes covering the second pixel region, and the first and second common electrodes have a same pattern.

11. A method for forming a thin film transistor substrate, the method comprising:
forming a gate line arranged on a substrate in a first direction;
forming a data line arranged in a second direction, the data line crossing the gate line to define adjacent first and second pixel regions, the data line being used in common by the first and second pixel regions;
forming an entire common line arranged in the second direction substantially parallel with the data line;
forming a thin film transistor including a gate electrode connected with the gate line, a source electrode connected with the data line, a drain electrode facing the source electrode, and an active layer to be overlapped with the gate electrode by interposing a gate insulating film between the active layer and the gate electrode;
forming a pixel electrode connected with the drain electrode;
forming a passivation film on an entire surface of the gate insulating film including the thin film transistor; and
forming common electrodes on the passivation film and connected with the common line through a common contact hole.

12. The method according to claim 11, further comprising:
forming a connection portion on the passivation film and over the data line by interposing the passivation film between the connection portion and the data line, the connection portion connecting the common electrodes of the first and second pixel regions with each other.

13. The method according to claim 11, wherein the gate line and the gate electrode have a double layer structure in which a transparent conductive material layer and a non-transparent conductive material layer are deposited in order.

14. The method according to claim 11, wherein the pixel electrode and the gate line are formed at a same time, and the pixel electrode is electrically connected with the drain electrode through a connection electrode.

15. The method according to claim 14, wherein the connection electrode and the common electrode are formed at a same time.

16. The method according to claim 11, wherein the common electrodes are formed over the common line at edges of the first and second pixel regions.

17. The method according to claim 12, wherein the common electrodes and the connection portion are formed at a same time.

18. The method according to claim 12, wherein the connection portion is in a bridge shape for connecting the common electrodes of the first and second pixel regions.

19. The method according to claim 11, wherein the common electrodes extend over the first or second pixel region, the common line, and an area between the common line and the first or second pixel region.

20. The method according to claim 11, wherein the step of forming the common electrodes includes:
forming first common electrodes covering the first pixel region, and
forming second common electrodes covering the second pixel region,
wherein the first and second common electrodes have a same pattern.

* * * * *